(12) United States Patent
Nikitin

(10) Patent No.: US 11,404,392 B1
(45) Date of Patent: Aug. 2, 2022

(54) MOLDED SEMICONDUCTOR MODULE FOR PCB EMBEDDING

(71) Applicant: Infineon Technologies AG, Neubiberg (DE)

(72) Inventor: Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/190,804

(22) Filed: Mar. 3, 2021

(51) Int. Cl.
| | |
|---|---|
| *H01L 23/00* | (2006.01) |
| *H01L 23/31* | (2006.01) |
| *H01L 21/56* | (2006.01) |
| *H01L 21/66* | (2006.01) |

(52) U.S. Cl.
CPC ............ *H01L 24/37* (2013.01); *H01L 21/565* (2013.01); *H01L 22/14* (2013.01); *H01L 23/3121* (2013.01); *H01L 24/09* (2013.01); *H01L 24/38* (2013.01); *H01L 2224/09183* (2013.01); *H01L 2224/37012* (2013.01)

(58) Field of Classification Search
CPC ....................................................... H01L 24/37
USPC ......................................................... 257/666
See application file for complete search history.

(56) References Cited

U.S. PATENT DOCUMENTS

2003/0015778 A1* 1/2003 Soyano .................... H01L 23/24
257/E23.184
2019/0273040 A1* 9/2019 Mohn ................ H01L 23/49861

* cited by examiner

*Primary Examiner* — Ajay Arora
(74) *Attorney, Agent, or Firm* — Murphy, Bilak & Homiller, PLLC

(57) ABSTRACT

A molded semiconductor module include: a semiconductor die attached to a main surface of a metal block. The die has a metal contact pad at a side of the die facing away from the metal block. A metal terminal has a contact region attached to the metal contact pad of the die, and a distal end region that joins the contact region and is bent upward in a direction away from the metal block such that the distal end region has a free end which terminates at a further distance from the metal block than the contact region. A molding compound encapsulates the die and covers the contact region of the metal terminal. The distal end region of the metal terminal protrudes through a surface of the molding compound that faces a same direction as the side of the die with the metal contact pad.

22 Claims, 13 Drawing Sheets

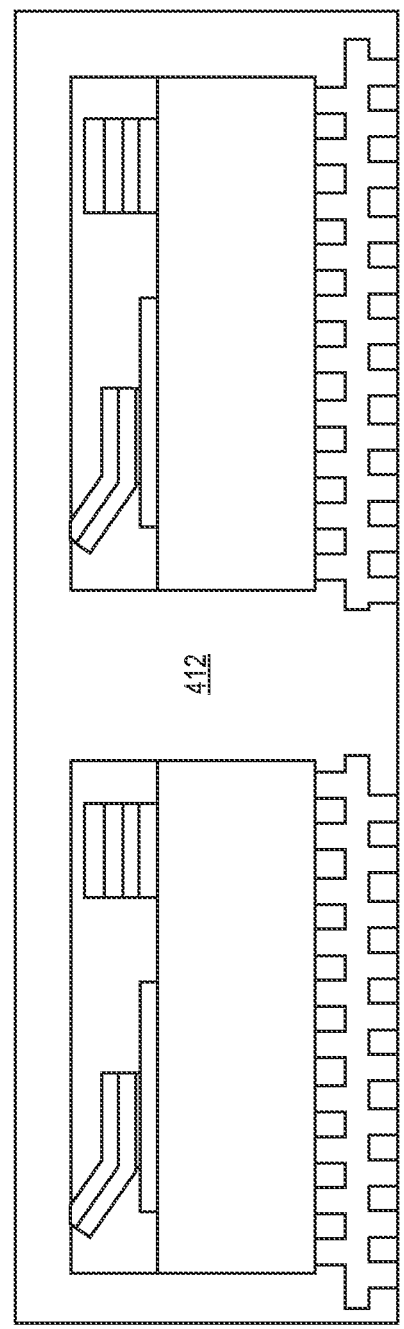

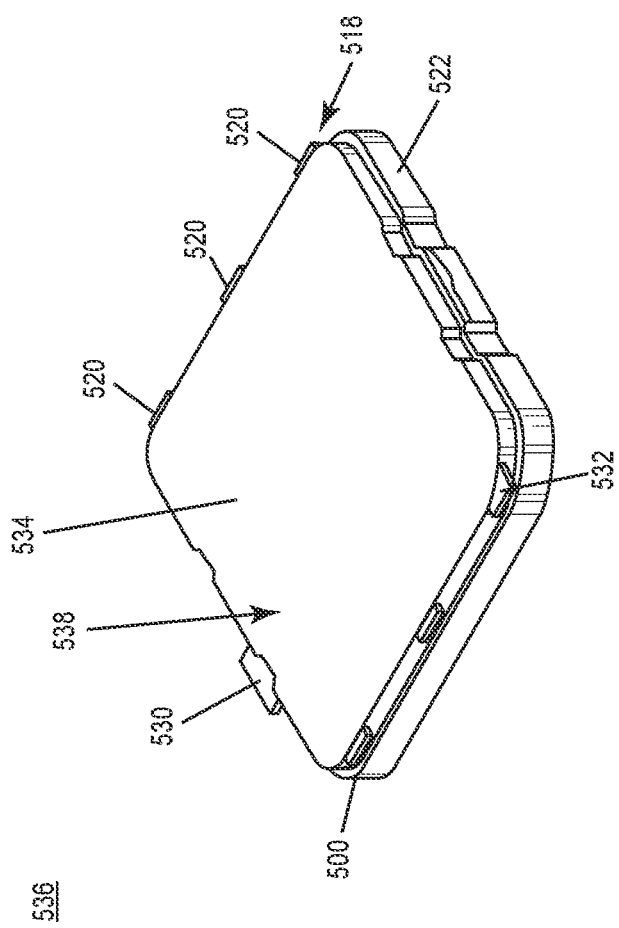

MOLDED SEMICONDUCTOR MODULE FOR PCB EMBEDDING

BACKGROUND

Power semiconductor modules for embedding in a PCB (printed circuit board) typically include a large metal block with a power semiconductor die attached to the metal block. The metal block and power semiconductor die are embedded in a PCB insulator material such as FR4. Holes are then formed in the insulator material to access electrical contact pads of the power semiconductor die, and the holes are filled with an electrically conductive material such as copper. Additional semiconductor dies and other components such as passives (capacitors, inductors, resistors, etc.) are typically attached to the top side of the PCB.

The process described above suffers from die placement accuracy issues. Also, accurate gate pad contacting is a problem. Furthermore, semiconductor material such as silicon is highly sensitive to laser drilling used to form the openings in the PCB insulator material, contamination from the PCB process, and ions present in FR4 and other types of glass-reinforced epoxy laminate materials used in PCB processing.

Accordingly, there is a need for an embedded power semiconductor module that does not suffer from the problems described above.

SUMMARY

According to an embodiment of a molded semiconductor module, the molded semiconductor module comprises: a metal block; a semiconductor die attached to a first main surface of the metal block, the semiconductor die having a first metal contact pad at a side of the semiconductor die facing away from the metal block; a first metal terminal having a first contact region attached to the first metal contact pad of the semiconductor die and a distal end region that joins the first contact region and is bent upward in a direction away from the metal block such that the distal end region has a free end which terminates at a further distance from the metal block than the first contact region; and a molding compound encapsulating the semiconductor die and covering the first contact region of the first metal terminal, wherein the distal end region of the first metal terminal protrudes through a surface of the molding compound that faces a same direction as the side of the semiconductor die with the first metal contact pad.

According to an embodiment of a method of producing a molded semiconductor module, the method comprises: attaching a semiconductor die to a first main surface of a metal block, the semiconductor die having a first metal contact pad at a side of the semiconductor die facing away from the metal block; attaching a contact region of a first metal terminal to the first metal contact pad of the semiconductor die, the first metal terminal having a distal end region that joins the contact region and is bent upward in a direction away from the metal block such that the distal end region has a free end which terminates at a further distance from the metal block than the contact region; and covering the semiconductor die and the contact region of the first metal terminal with a molding compound such that the distal end region of the first metal terminal protrudes through a surface of the molding compound that faces a same direction as the side of the semiconductor die with the first metal contact pad.

According to an embodiment of an electronic assembly, the electronic assembly comprises: a printed circuit board; and a molded semiconductor module embedded in an electrically insulating body of the printed circuit board, wherein the molded semiconductor module comprises: a semiconductor die attached to a first main surface of a metal block, the semiconductor die having a first metal contact pad at a side of the semiconductor die facing away from the metal block; a first metal terminal having a contact region attached to the first metal contact pad of the semiconductor die and a distal end region that joins the contact region and is bent upward in a direction away from the metal block such that the distal end region has a free end which terminates at a further distance from the metal block than the contact region; and a molding compound encapsulating the semiconductor die and covering the contact region of the first metal terminal, wherein the distal end region of the first metal terminal protrudes through a surface of the molding compound that faces a same direction as the side of the semiconductor die with the first metal contact pad, wherein the electrically insulating body of the printed circuit board encapsulates the contact region and the distal end region of the first metal terminal.

According to an embodiment of a method of producing an electronic assembly, the method comprises: embedding a molded semiconductor module in an electrically insulating body of a printed circuit board, the molded semiconductor module comprising: a semiconductor die attached to a first main surface of a metal block, the semiconductor die having a first metal contact pad at a side of the semiconductor die facing away from the metal block; a first metal terminal having a contact region attached to the first metal contact pad of the semiconductor die and a distal end region that joins the contact region and is bent upward in a direction away from the metal block such that the distal end region has a free end which terminates at a further distance from the metal block than the contact region; and a molding compound encapsulating the semiconductor die and covering the contact region of the first metal terminal, wherein the distal end region of the first metal terminal protrudes through a surface of the molding compound that faces a same direction as the side of the semiconductor die with the first metal contact pad, wherein the electrically insulating body of the printed circuit board encapsulates the contact region and the distal end region of the first metal terminal; forming a plurality of openings in both the electrically insulating body of the printed circuit board and the molding compound of the molded semiconductor module that expose the contact region of the first metal terminal; and filling the plurality of openings with an electrically conductive material.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 4A through 4G illustrate respective partial cross-sectional views of an embodiment of embedding molded semiconductor modules in a PCB.

FIGS. 5A through 5C illustrate side perspective views of another embodiment of a molded semiconductor module during different stages of production.

DETAILED DESCRIPTION

The embodiments described herein provide a molded semiconductor module for PCB embedding, and related methods of production. The molded semiconductor module embodiments described herein avoid ion contamination and corrosion issues which typically occur at higher voltages, allowing for increased voltages beyond 48V, e.g., to 750V, 1200V or even higher. Also, standard molding processes may be used to produce the molded semiconductor module, minimizing impact on manufacturing.

Described next, with reference to the figures, are exemplary embodiments of the molded semiconductor module for PCB embedding and related methods of production.

FIGS. 1A through 1D illustrate side perspective views of a molded semiconductor module during different stages of production. In one embodiment, the molded semiconductor module produced by the process shown in FIGS. 1A through 1D has a rated voltage in a range of 750V to 1200V. The molded semiconductor module may instead have a lower (<750V) rated voltage or a higher (>1200V) rated voltage.

Figure 1B:
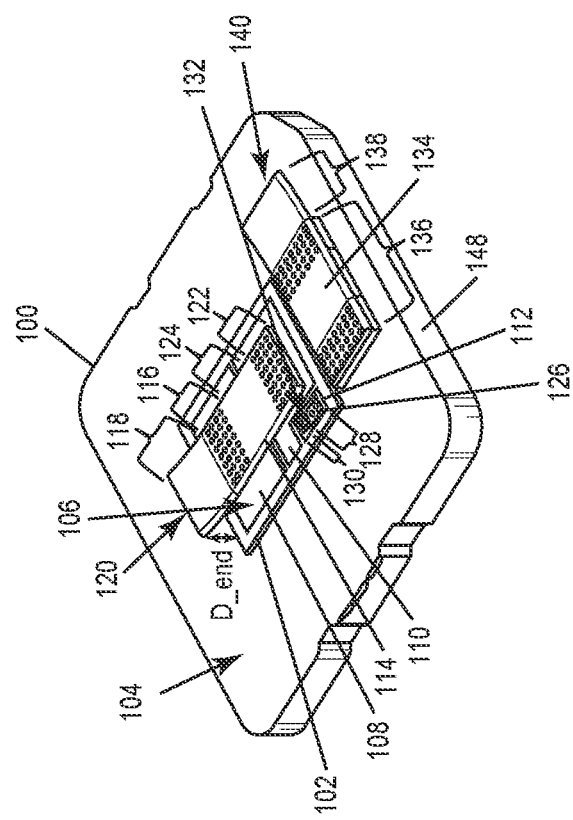
FIGS. 1A through 1D illustrate side perspective views of a molded semiconductor module during different stages of production.
Figure 1A:
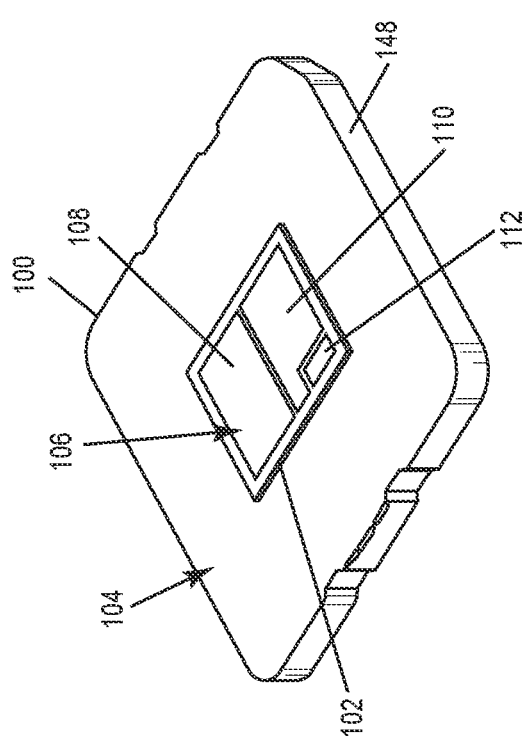

FIG. 1A shows a metal block 100 and a semiconductor die 102 attached to a first main surface 104 of the metal block 102. The metal block 100 may be part of a lead frame made of Cu, Cu alloy, clad material, other conductive materials, part of a PCB, part of an IMS (insulated metal substrate), etc. The semiconductor die 102 may be attached to the metal block 102 using any standard die attach material such as solder, glue, adhesive, etc. The die attach material may be applied to the first main surface 104 of the metal block 100, the back side of the semiconductor die 102, or both. The die attach material and the backside of the semiconductor die 102 are out of view in FIG. 1A.

The metal block 102 to which the semiconductor die 102 is attached may be coined or flat. The metal block 102 may be produced from a metal sheet, e.g., by stamping, etching, etc. In one embodiment, the metal block 102 comprises copper or a copper alloy. For example, the metal block 102 may comprise Cu, AlCu, AlSiCu, etc. Still other metal materials such as Al may be used for the metal block 100. More than one semiconductor die 102 may be attached to the first main surface 104 of the metal block 102.

The semiconductor die 102 may comprise any type of semiconductor material such as Si, SiC, GaN, etc. The semiconductor die 102 may include a lateral or vertical power device such as a power transistor and/or a power diode. In the case of a lateral power device, all power and signal connections to the semiconductor die 102 are made at the front side 106 of the die 102. For example, in the case of a lateral GaN power HEMT (high-electron-mobility transistor), source, drain and gate connections may be made at the front side 106 of the die 102. In the case of a vertical power device, some power and possibly signal connections to the semiconductor die 102 are made at the back side (out of view) of the die 102. For example, in the case of a vertical power MOSFET (metal-oxide-semiconductor field-effect transistor) or vertical IGBT (insulated gate bipolar transistor), the source/emitter and gate connections may be made at the front side 106 of the die 102 and the drain/collector connection may be made at the back side of the die 102.

In each case, the semiconductor die 102 has a first metal contact pad 108 at the front side 106 of the semiconductor die 102, i.e., the side which faces away from the metal block 100 in FIG. 1A. In one embodiment, the semiconductor die 102 has a second metal contact pad 110 at the same side 106 of the semiconductor die 102 with the first metal contact pad 106. The first and second metal contact pads 108, 110 may be at the same or different potential. For example, in the case of a lateral power transistor device, the first metal contact pad 108 may be at source/emitter potential and the second metal contact pad 110 may be at drain/collector potential. In the case of a vertical power transistor device, both the first metal contact pad 108 and the second metal contact pad 110 may be at source/emitter potential and the drain/collector potential contact pad may be at the back side of the semiconductor die 102 which faces the metal block 104 and is out of view in FIG. 1A.

The semiconductor die 102 may also have a third metal contact pad 112 at the same side 106 of the semiconductor die 102 with the first and second metal contact pads 108, 110. In the case of a lateral or vertical power transistor device, the third metal contact pad 112 may be a gate contact pad for receiving a gate/control signal. The gate contact pad may instead be formed at the back side of the semiconductor die 102.

FIG. 1B shows a first metal terminal 114 for the molded semiconductor module. The first metal terminal 114 has a first contact region 116 attached to the first metal contact pad 108 of the semiconductor die 102. The first contact region 116 of the first metal terminal 114 may be attached to the first metal contact pad 108 of the semiconductor die 102 by sintering, soldering, diffusion soldering, etc. In one embodiment, the first contact region 116 of the first metal terminal 114 is at least ten times thicker than the first metal contact pad 108 of the semiconductor die 102 as measured in a direction perpendicular to the first main surface 104 of the metal block 102. For example, the first contact region 116 of the first metal terminal 114 may have a thickness of at least 100 microns and the first metal contact pad 108 of the semiconductor die 102 may have a thickness of 10 microns or less.

The first metal terminal 114 for the molded semiconductor module also has a distal end region 118 that joins the contact region 116 of the first metal terminal 114. The distal end region 118 is bent in a direction away from the metal block 100 such that the distal end region 118 has a free end 120 which terminates at a further distance (D_end) from the metal block 100 than the contact region 116 of the first metal terminal 114.

In one embodiment, the first metal terminal 114 for the molded semiconductor module is a metal clip. In the case of a metal clip as the first metal terminal 114, the free end 120 of the distal end region 118 of the first metal terminal 114 may be formed before terminal attachment by stamping, rolling, etc.

In another embodiment, the first metal terminal 114 for the molded semiconductor module is a metal ribbon. In the case of a metal ribbon as the first metal terminal 114, the free end 120 of the distal end region 118 of the first metal terminal 114 may correspond to an unattached tail of the metal ribbon. The unattached tail of the metal ribbon may be bent before or after terminal attachment, e.g., by pulling. For example, after attaching the first contact region 116 of the first metal terminal 114 to the first metal contact pad 108 of the semiconductor die 102, the unattached part of the metal ribbon may be bent away from the metal block 100 to form the distal end region 118 with the bent free end 120.

Regardless of the type of terminal (e.g., clip, ribbon, etc.), the first metal terminal 114 for the molded semiconductor module may comprise Cu, Al, Au, a metal alloy, etc. As explained above, the metal contact pads 108, 110 of the semiconductor die 102 may comprise a standard metallization such as Cu, AlCu, AlSiCu, Al, etc. for contacting the first metal terminal 114.

As explained above, the semiconductor die 102 may have a second metal contact pad 110 at the same side 106 of the semiconductor die 102 with the first metal contact pad 108. If the first and second metal contact pads 108, 110 are at the same potential, the first metal terminal 114 for the molded semiconductor module may have a second contact region 122 that is attached to the second metal contact pad 110 of the semiconductor die 102 by sintering, soldering, diffusion soldering, etc. In this case, the first and second contact regions 116, 122 of the first metal terminal 114 may be joined to one another by a bridge region 124 of the first metal terminal 114.

Also as explained above, the semiconductor die 102 may have a third metal contact pad 112 at the same side 106 of the semiconductor die 102 with the first pad and second metal contact pads 108, 110. In this case, a second metal terminal 126 for the molded semiconductor module may have a contact region 128 that is attached to the third metal contact pad 112 of the semiconductor die 102 by sintering, soldering, diffusion soldering, etc.

The second metal terminal 126 for the molded semiconductor module also has a distal end region 130 that joins the contact region 128 of the second metal terminal 126. The distal end region 130 of the second metal terminal 126 is bent in a direction away from the metal block 100 such that the distal end region 130 of the second metal terminal 126 has a free end 132 which terminates at a further distance from the metal block 100 than the contact region 128 of the second metal terminal 126. The second metal terminal 126 may be a metal clip, a metal ribbon, etc. In the case of a metal ribbon, the unattached tail of the metal ribbon may be bent before or after terminal attachment to form the distal end region 130 of the second metal terminal 126 with the bent free end 132, e.g., by pulling.

In the case of a vertical power device, one of the load contact pads is at the back side of the semiconductor die 102. In this case, the electrical connection for the load contact pad at the back side of the semiconductor die 102 may be provided at the same side of the molded semiconductor module as for the other load and control electrical connections to the semiconductor die 102, by providing a third metal terminal 134 and attaching a contact region 136 of the third metal terminal 134 to the first main surface 104 of the metal block 102 by sintering, soldering, diffusion soldering, etc. The third metal terminal 134 may be thicker than the first and second metal terminals 114, 126 to account for the height of the semiconductor die 102.

The third metal terminal 134 for the molded semiconductor module also has a distal end region 138 that joins the contact region 136 of the third metal terminal 134 and is bent in a direction away from the metal block 100 such that the distal end region 138 of the third metal terminal 134 has a free end 140 which terminates at a further distance from the metal block 100 than the contact region 136 of the third metal terminal 134. The third metal terminal 126 may be a metal clip, a metal ribbon, etc. In the case of a metal ribbon, the unattached tail of the metal ribbon may be bent before or after terminal attachment to form the distal end region 138 of the third metal terminal 134 with the bent free end 140, e.g., by pulling.

FIG. 10 shows the semiconductor module after molding. During the molding process, the semiconductor die 102 and the first contact region 116 of the first metal terminal 114 are covered with a molding compound 142 such that the distal end region 118 of the first metal terminal 114 protrudes through a surface 144 of the molding compound 142 that faces the same direction as the side 106 of the semiconductor die 102 with the first metal contact pad 108. For example, the molding compound 142 may be formed by placing the assembly in a three-dimensional chamber and injecting liquified encapsulant material into the chamber. Examples of such techniques include injection molding, transfer molding, compression molding, and film-assist molding. In another embodiment, the molding compound 142 may be formed by a lamination technique. The molding compound 142 may comprise a wide variety of electrically insulating encapsulant materials including ceramics, epoxy materials and thermosetting plastics, to name a few.

If the semiconductor die 102 has a second metal contact pad 110 and/or a third metal contact pad 112 at the same side 106 of the semiconductor die 102 with the first metal contact pad 106, the contact region 128 of the second metal terminal 126 and/or the contact region 136 of the third metal terminal 134 are covered with the molding compound 142 such that the corresponding terminal distal end region 130/138 protrudes through the surface 144 of the molding compound 142 that faces the same direction as the side 106 of the semiconductor die 102 with the first metal contact pad 108. For example, a film-assisted molding process may be applied, or after the molding, the free end 120, 132, 140 of the terminals 114, 126, 134 may be opened/exposed by a de-flashing process, laser opening, grinding etc. In each case, probing of each exposed terminal distal end region 118/130/138 at the corresponding exposed end 120/132/140 is provided for during electrical testing of the molded semiconductor module. Accordingly, each exposed terminal distal end region 118/130/138 is configured for electrical probing during electrical testing of the molded semiconductor module.

Figure 1D:
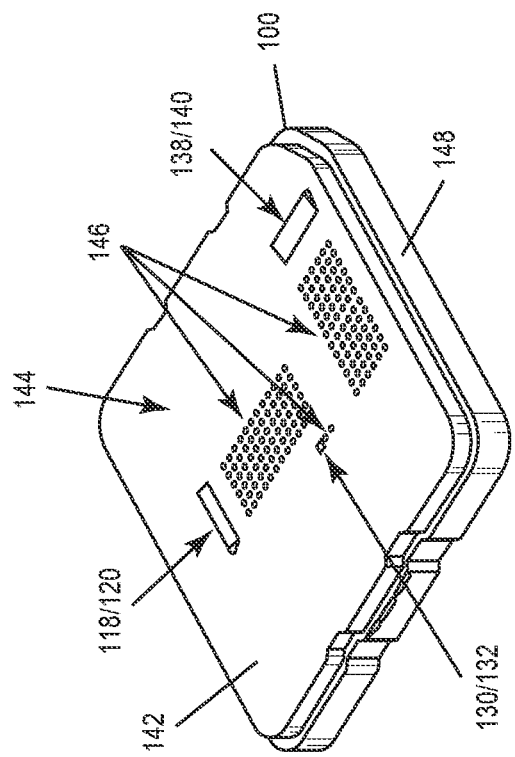
Figure 1C:
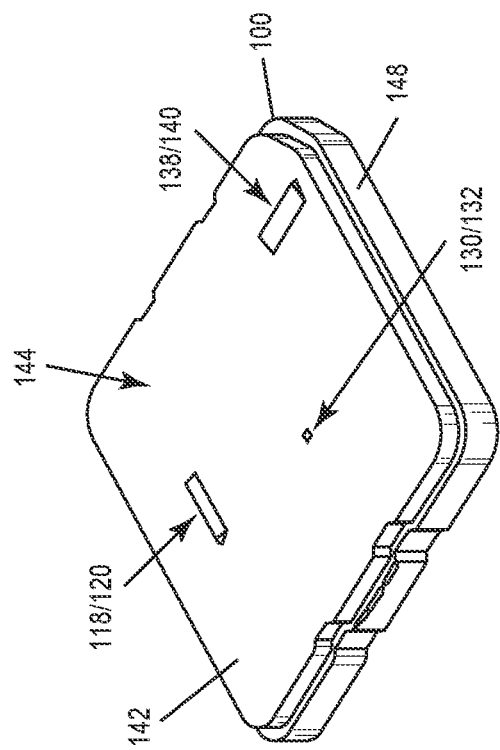

FIG. 1D shows the molded semiconductor module after openings 146 are formed in the surface 144 of the molding compound 142 that faces the same direction as the side 106 of the semiconductor die 102 with the first metal contact pad 108. A group of one or more openings 146 expose a corresponding terminal contact region 116/122/128/136 covered by the molding compound 142. The openings 146 may be formed by laser drilling, mechanical drilling, etching, etc. The openings 146 are subsequently filled with an electrically conductive material, e.g., by plating, deposition, etc. Accordingly, the contact region 116, 122, 128, 136 of each metal terminal 114, 126, 134 for the molded semiconductor module is configured for permanent electrical contact through the corresponding group of opening(s) 146 formed in the molding compound 142.

The metal block 100 of the molded semiconductor module has a second main surface which is opposite the first main surface 104. The second main surface of the metal block is out of view in FIGS. 1A through 1D. A border 148 extends between the first main surface 104 and the second main surface. In one embodiment, the distal end region 118 of each metal terminal 114, 126, 134 does not extend beyond the border 148 of the metal block 100. The molding compound 142 may cover most or all of the first main surface 104 of the metal block 100, e.g., as shown in FIGS. 10 and 1D. The molding compound 142 may also extend onto the border 148 of the metal block 100.

The production stages shown in FIGS. 1A through 1D may be carried out via a batch process. That is, instead of successively processing individual modules, several modules may be processed in parallel, e.g., by using a lead frame structure for the metal blocks 100 of the modules and a terminal frame structure for the terminals 114, 126, 134 of the modules. The molded semiconductor modules can be separated from one another any time after molding by cutting through a periphery region of the lead frame and terminal frame structures, e.g., by stamping, etching, laser drilling, etc.

As explained above, an additional (third) metal terminal 134 may be provided for routing an electrical connection at the back side of the semiconductor die 102 to the same side of the molded semiconductor module as for the electrical connections to front side 106 of the semiconductor die 102. However, the additional metal terminal 134 may be attached to the first main surface 104 of the metal block 102, e.g., as shown in FIG. 1B. In this case, the additional metal terminal 134 is thicker than the first and second metal terminals 114, 126 to account for the height of the semiconductor die 102.

Figure 2:
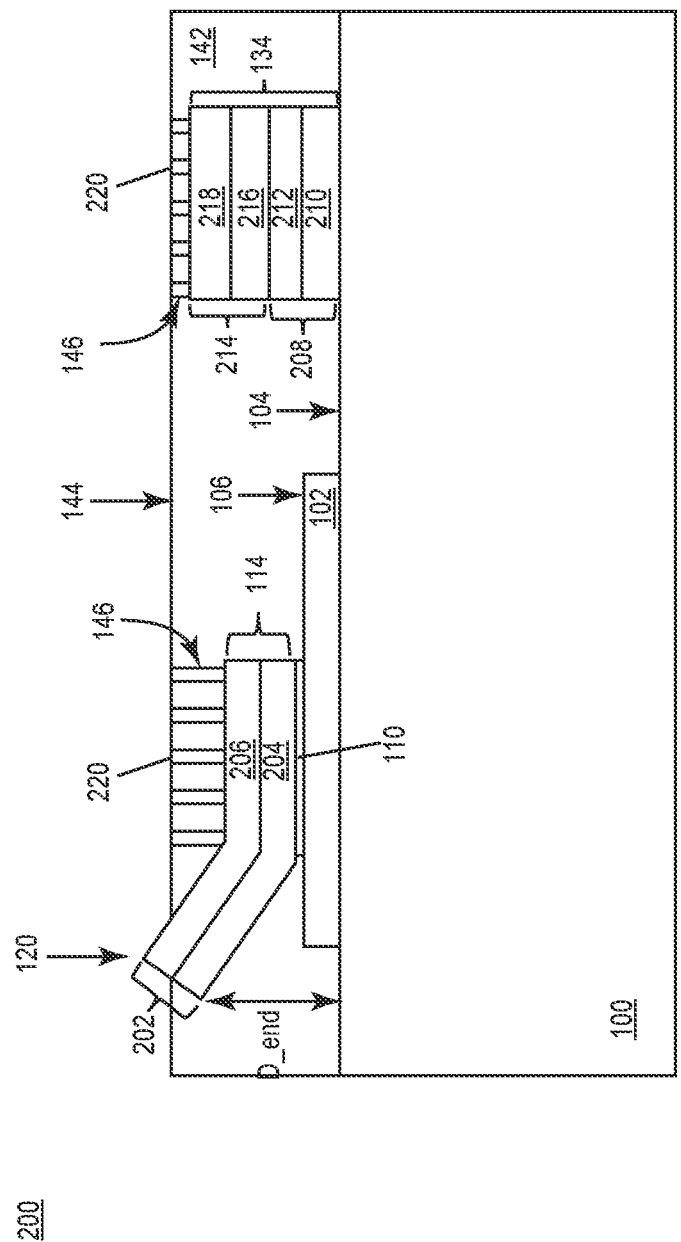
FIG. 2 illustrates a cross-sectional view of a molded semiconductor module produced in accordance with the stages illustrated in FIGS. 1A through 1D, according to an embodiment.

FIG. 2 illustrates a cross-sectional view of a molded semiconductor module 200 produced in accordance with the stages illustrated in FIGS. 1A through 1D. The molded semiconductor module 200 includes the additional (thicker) metal terminal 134 attached to the first main surface 104 of the metal block 102. According to this embodiment, the metal terminals 114, 134 are Al/Cu clad wedges/ribbons. The first metal terminal 114 is formed by a single Al/Cu clad wedge/ribbon 202 that includes a base Al layer 204 and a Cu cladding layer 206. The additional (thicker) metal terminal 134 is formed by a first (lower) Al/Cu clad wedge/ribbon 208 having a base Al layer 210 and a Cu cladding layer 212, and a second (upper) Al/Cu clad wedge/ribbon 214 having a base Al layer 216 clad and a Cu cladding layer 218. As explained above, the openings 146 formed in the molding compound 142 are filled with an electrically conductive material to form electrically conductive vias 220 to the corresponding terminals 114, 126, 134.

Figure 3:
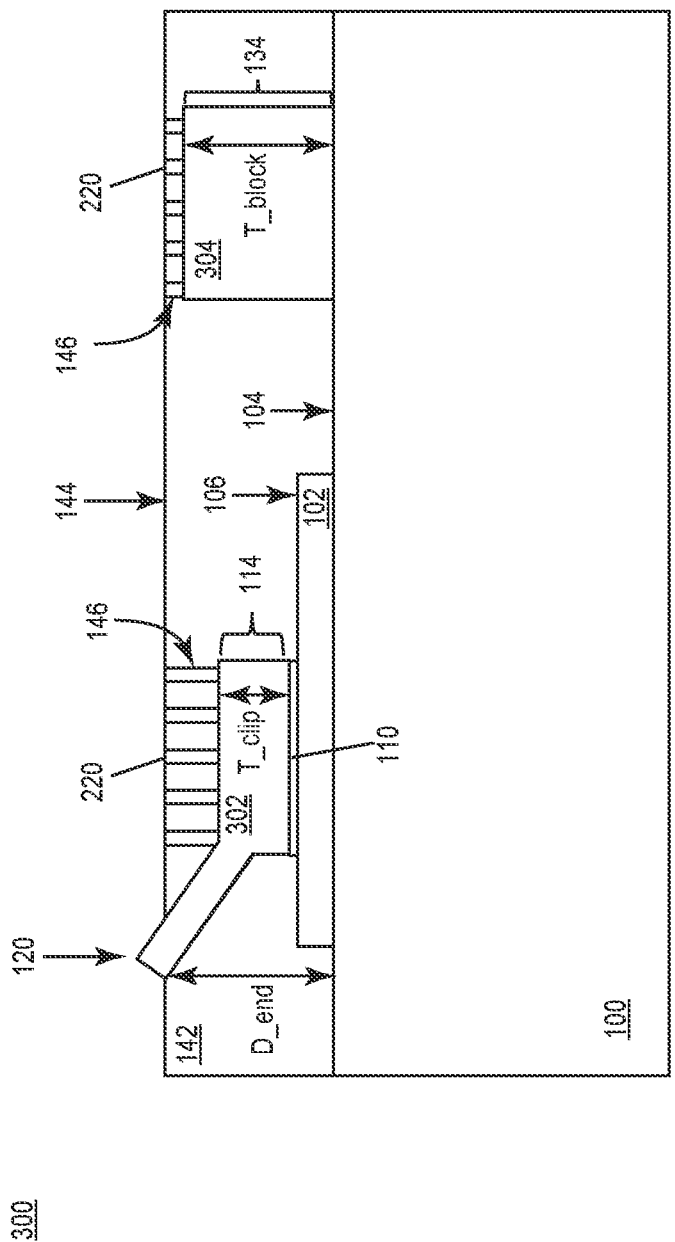
FIG. 3 illustrates a cross-sectional view of a molded semiconductor module produced in accordance with the stages illustrated in FIGS. 1A through 1D, according to another embodiment.

FIG. 3 illustrates a cross-sectional view of a molded semiconductor module 300 produced in accordance with the stages illustrated in FIGS. 1A through 1D, according to another embodiment. The molded semiconductor module 200 includes the additional (thicker) metal terminal 134 attached to the first main surface 104 of the metal block 102. According to this embodiment, the first metal terminal 114 is a Cu clip 302 and the additional metal terminal 134 is a Cu block 304 that is thicker (T_block>T_clip) than the Cu clip 302.

In FIG. 3, the top surface of the first metal terminal 114 and of the additional metal terminal 134 are not shown as being coplanar. Accordingly, the conductive vias 220 in contact with the first metal terminal 114 are longer/taller than the conductive vias 220 in contact with the additional metal terminal 134. However, the top surface of the first metal terminal 114 and of the additional metal terminal 134 instead may be coplanar. In this case, the conductive vias 220 in contact with the first metal terminal 114 have the same length/height as the conductive vias 220 in contact with the additional metal terminal 134.

FIGS. 4A through 4G illustrate respective partial cross-sectional views of an embodiment of embedding molded semiconductor modules in a PCB. The illustrated PCB embedding process uses the molded semiconductor module 200 shown in FIG. 2. However, any of the molded semiconductor modules described herein may be used instead.

Figure 4A:
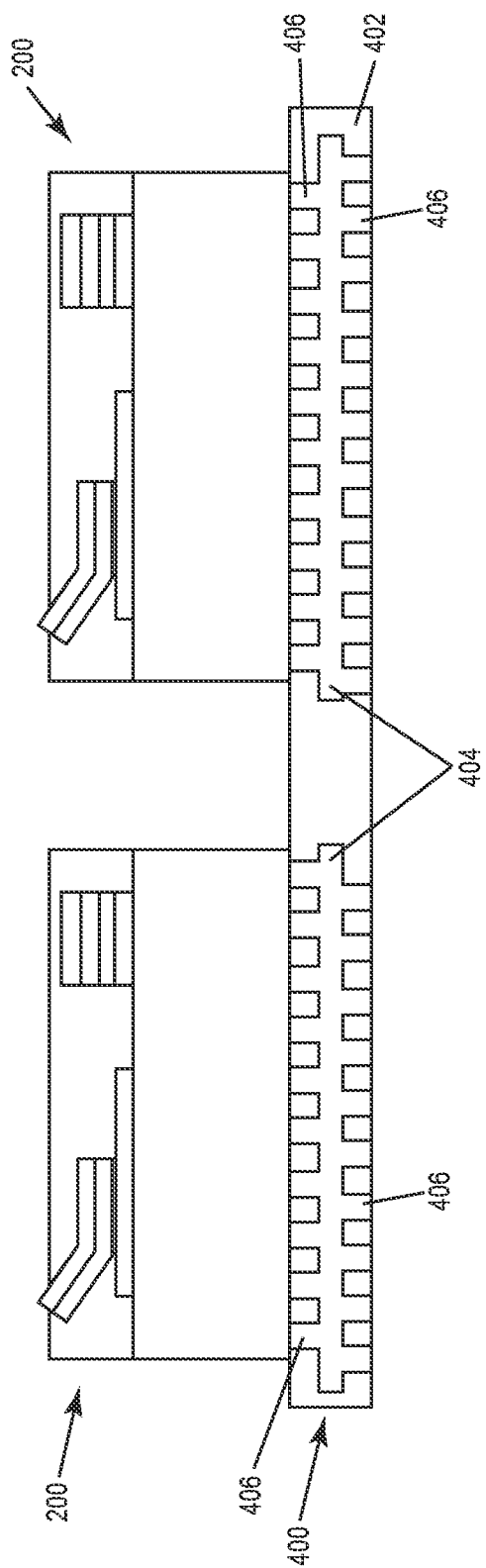

FIG. 4A shows two molded semiconductor modules 200; however more than two molded semiconductor modules 200 may be embedded in the PCB. After producing and testing the molded semiconductor modules 200, the molded semiconductor modules 200 are placed on a first PCB laminate 400. The first PCB laminate 400 may include a first glass-reinforced epoxy laminate material 402 such as FR-4 which is a composite material composed of woven fiberglass cloth with an epoxy resin binder. One or more copper layers 404 may be embedded in and/or attached to either or both main surfaces of the first glass-reinforced epoxy laminate material 402. Copper vias 406 connect to each copper layer 404.

Figure 4B:
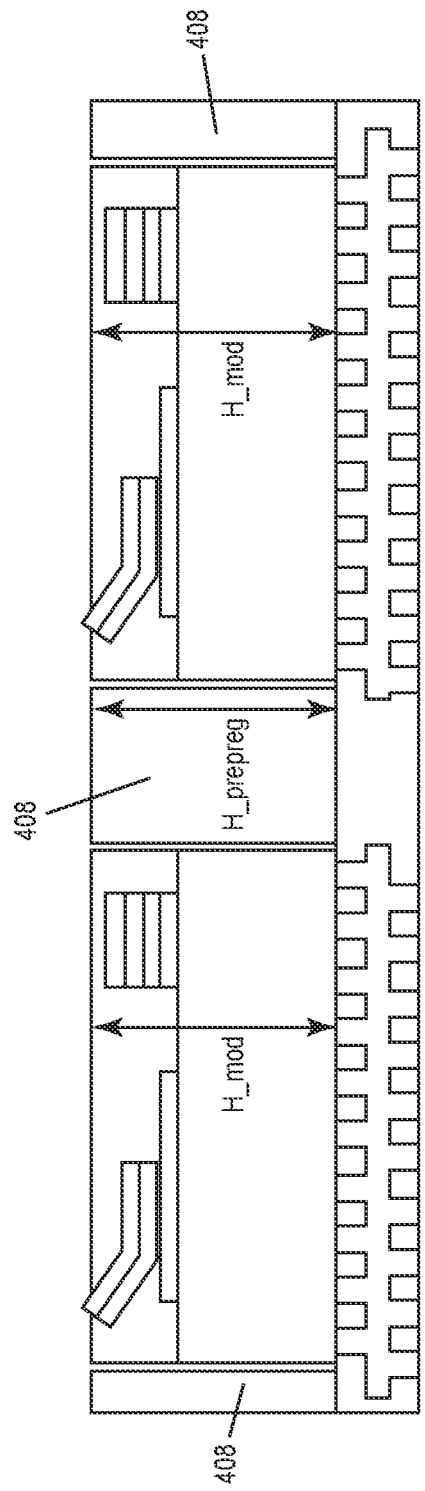

FIG. 4B shows structured pre-preg materials 408 placed on the first glass-reinforced epoxy laminate material 402 in the open space between the molded semiconductor modules 200. The structured pre-preg materials 408 comprise a PCB dielectric such as FR4 and have a height (H_prepreg) corresponding to the height (H_mod) of the molded semiconductor modules 200. The structured pre-preg materials 408 may comprise the same PCB dielectric as the first glass-reinforced epoxy laminate material 402 or a different PCB dielectric, depending on the end application.

Figure 4C:
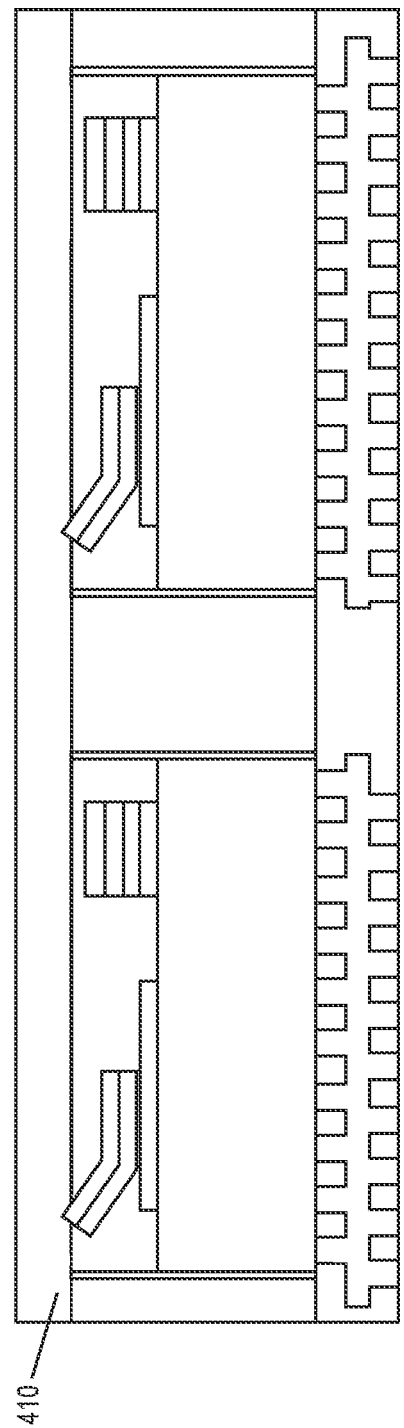

FIG. 4C shows a second glass-reinforced epoxy laminate material 410 placed on the structured pre-preg materials 408 and the molded semiconductor modules 200. The second glass-reinforced epoxy laminate material 410 may comprise the same PCB dielectric as the first glass-reinforced epoxy laminate material 402 or a different PCB dielectric, depending on the end application.

FIG. 4D shows the stacked structure after a lamination process which may include elevated temperature, e.g., 130-150° C., elevated pressure, e.g., 3 MPa and vacuum. The lamination process cures the PCB dielectrics of the first glass-reinforced epoxy laminate material 402, the second glass-reinforced epoxy laminate material 410, and the structured pre-preg materials 408 to form a first electrically insulating body 412 of the PCB in which the molded semiconductor modules 200 are embedded.

Figure 4E:
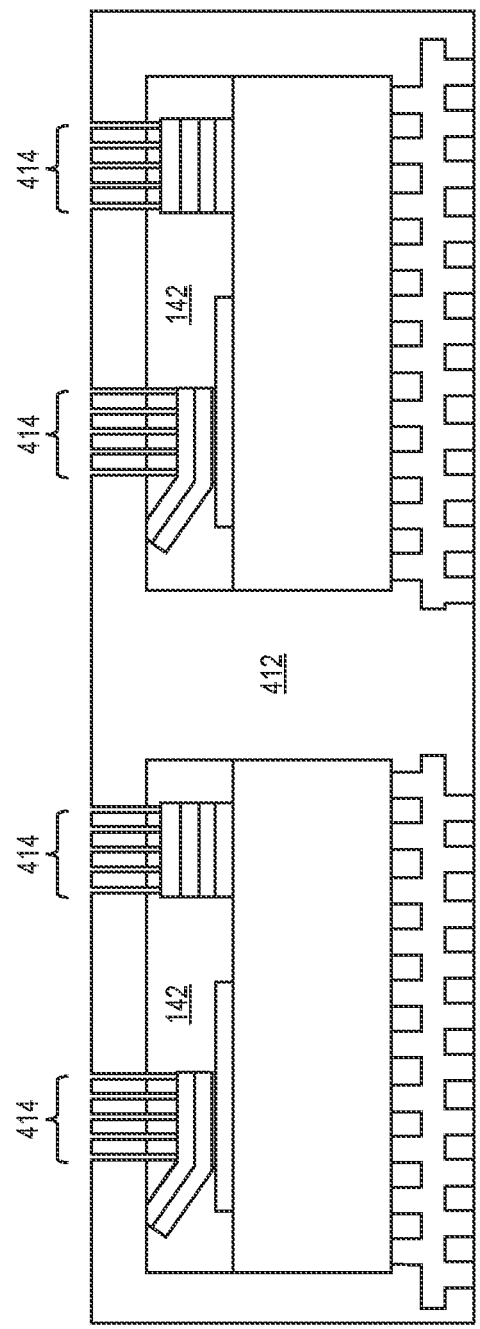

FIG. 4E shows first openings 414 formed in both the electrically insulating body 412 of the PCB and the molding compound 142 of the molded semiconductor modules 200. The first openings 414 may be formed by laser drilling, mechanical drilling, etc. Two terminals are shown for each molded semiconductor module 200 due to the orientation of FIG. 4E. The molded semiconductor modules 200 may have more or fewer terminals exposed through the first openings 414, as explained above.

The first openings 414 expose the contact regions of the respective module terminals. If the module terminals are coplanar, the first openings 414 have a relatively uniform depth (e.g., 50 microns). The module terminals protect the underlying metal contact pads 108, 110, 112 of the semiconductor dies 102 from being damaged by the laser/mechanical via drilling process used to form the first openings 414.

Figure 4F:
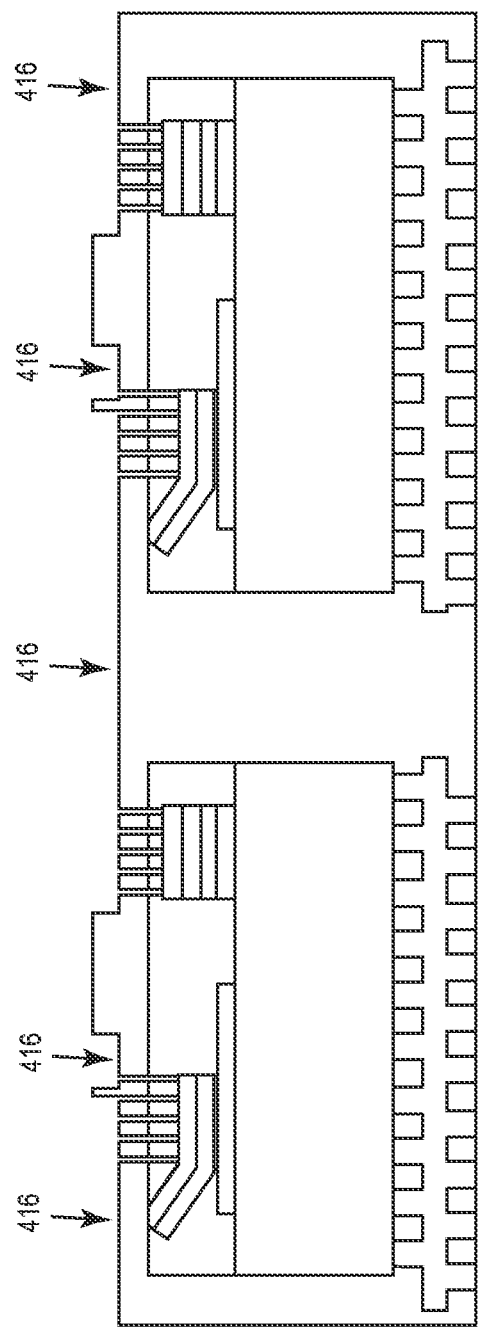

FIG. 4F shows second openings 416 formed in the electrically insulating body 412 of the PCB. The second openings 416 may be formed by laser drilling, mechanical drilling, etc. to allow for subsequent formation of metal redistribution structures and/or contact pads in the electrically insulating body 412 of the PCB. All openings 414, 416 may be cleaned, e.g., using a Cu roughening process.

Figure 4G:
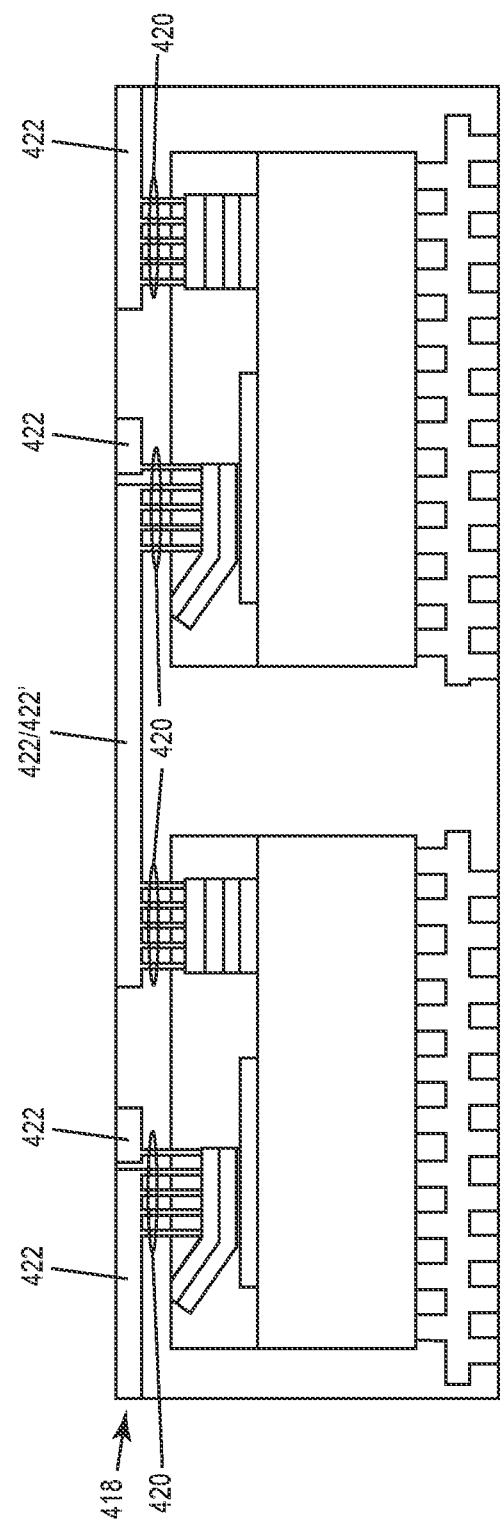

FIG. 4G shows the first and second openings 414, 416 filled with an electrically conductive material 418 such as Cu, e.g., using a Cu-galvanic process. The electrically conductive material 418 in the first openings 414 form electrically conductive vias 420 which connect to the contact regions of the respective module terminals. The electrically conductive material 418 in the second openings 416 form metal redistribution structures and/or contact pads 422. For example, a metal redistribution structure 422' may electrically connect one load terminal (e.g., drain) of a first molded semiconductor module 200 to the opposite terminal (e.g., source) of a second molded semiconductor module 200 to form a circuit such as a half bridge. Other/different module interconnections are possible by structing the electrically conductive material 418 accordingly.

The PCB lamination process may be continued to form one or more additional PCB layers above the first electrically insulating body 412 of the PCB. The additional PCB layer(s) may be used to provide additional levels of electrical interconnection and/or redistribution. Components such as drivers, controllers, passives (inductors, capacitors, etc.), coolers, etc. may be attached to the uppermost layer of the PCB and electrically connected to the molded semiconductor modules 200 embedded therein to form an electronic circuit such as a multi-phase phase drive for power steering, climate compressors, power converters, power inverters, etc. None of the terminal distal end regions 118, 130, 138 of the molded semiconductor module as embedded in the PCB are contacted by a metal connector outside the molded semiconductor module.

Figure 5B:
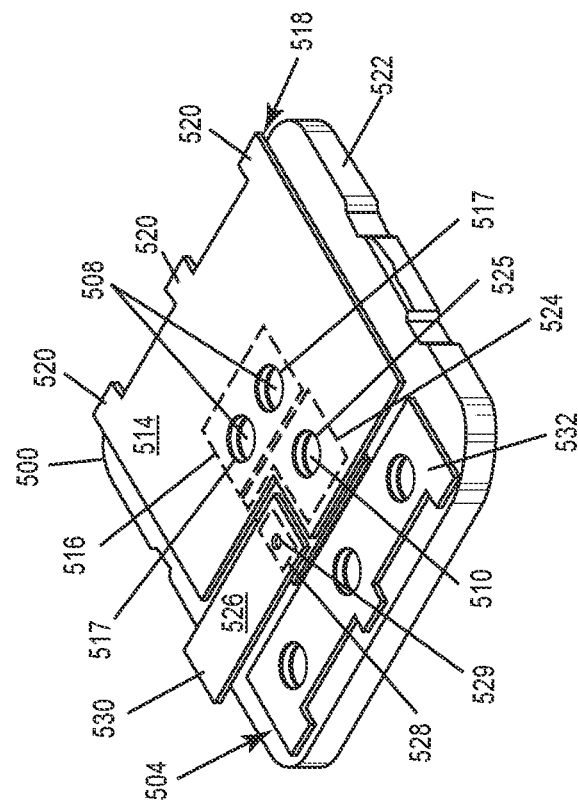
Figure 5A:
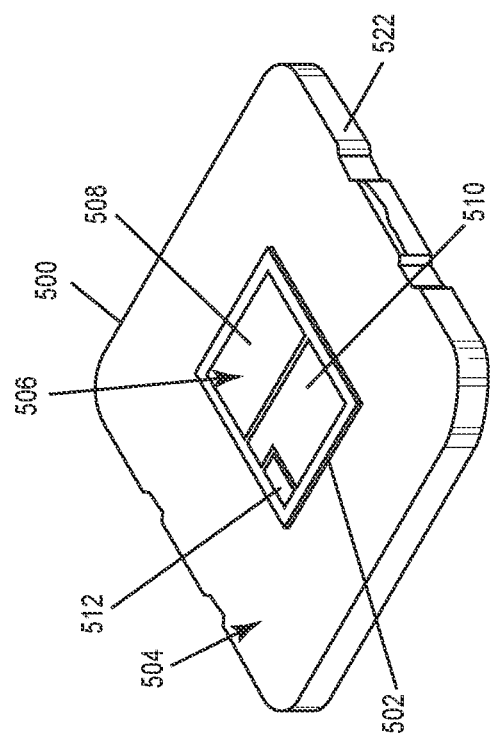

FIGS. 5A through 5C illustrate side perspective views of another embodiment of a molded semiconductor module during different stages of production. The molded semiconductor module produced by the process shown in FIGS. 5A through 5C may have a rated voltage in a range of 750V to 1200V. The molded semiconductor module may instead have a lower (<750V) rated voltage or a higher (>1200V) rated voltage.

FIG. 5A shows a metal block 500 and a semiconductor die 502 attached to a first main surface 504 of the metal block 502. The metal block 500 may be of the same kind previously described herein. Likewise, the semiconductor die 102 may be of the same kind previously described herein and may be attached to the metal block 502 also as previously described herein. Accordingly, the semiconductor die 502 may have a first metal contact pad 508 at the front side 506 of the semiconductor die 502, i.e., the side which faces away from the metal block 500 in FIG. 5A. The semiconductor die 502 may also have a second metal contact pad 510 at the same side 506 of the semiconductor die 502 with the first metal contact pad 506. The first and second metal contact pads 508, 510 may be at the same or different potential, e.g., as previously described herein. The semiconductor die 502 may further have a third metal contact pad 512 at the same side 506 of the semiconductor die 502 with the first and second metal contact pads 508, 510, e.g., as previously described herein.

FIG. 5B shows a first metal clip 514 for the molded semiconductor module. The first metal clip 514 has a first contact region 516 attached to the first metal contact pad 508 of the semiconductor die 502. The first contact region 516 of the first metal clip 514 may be attached to the first metal contact pad 508 of the semiconductor die 502 by sintering, soldering, diffusion soldering, etc. For example, the first contact region 516 of the first metal clip 514 may include one or more openings 517 for storing or accommodating solder paste (not shown) during clip attach. In one embodiment, the first metal clip 514 is at least ten times thicker than the first metal contact pad 508 of the semiconductor die 502 as measured in a direction perpendicular to the first main surface 504 of the metal block 502. For example, the first metal clip 514 may have a thickness of at least 100 microns and the first metal contact pad 508 of the semiconductor die 502 may have a thickness of 10 microns or less.

The first metal clip 514 for the molded semiconductor module also has a distal end region 518. The distal end region 518 of the first metal clip 514 may have one or more tabs or protrusions 520 that laterally extend beyond the border/edge 522 of the metal block 500.

As explained above, the semiconductor die 502 may have a second metal contact pad 510 at the same side 506 of the semiconductor die 502 with the first metal contact pad 508. If the first and second metal contact pads 508, 510 are at the same potential, the first metal clip 514 may have a second contact region 524 that is attached to the second metal contact pad 510 of the semiconductor die 502 by sintering, soldering, diffusion soldering, etc. For example, the second contact region 524 of the first metal clip 514 may include one or more openings 525 for storing or accommodating solder paste (not shown) during clip attach.

Also as explained above, the semiconductor die 502 may have a third metal contact pad 512 at the same side 506 of the semiconductor die 502 with the first pad and second metal contact pads 508, 510. In this case, a second metal clip 526 for the molded semiconductor module may have a contact region 528 that is attached to the third metal contact pad 512 of the semiconductor die 502 by sintering, soldering, diffusion soldering, etc. For example, the contact region 528 of the second metal clip 526 may include one or more openings 529 for storing or accommodating solder paste (not shown) during clip attach.

The second metal clip 526 for the molded semiconductor module also has a distal end region 530. The distal end region 530 of the second metal clip 526 laterally extends beyond the border/edge 522 of the metal block 500.

In the case of a vertical power device, one of the load contact pads is at the back side of the semiconductor die 502. In this case, the electrical connection for the load contact pad at the back side of the semiconductor die 502 may be provided at the same side of the molded semiconductor module as for the other load and control electrical connections to the semiconductor die 502, by attaching a third metal terminal 532 to the first main surface 504 of the metal block 502 by sintering, soldering, diffusion soldering, etc.

FIG. 5C shows the semiconductor module after molding. During the molding process, the semiconductor die 502 and the first contact region 516 of the first metal clip 514 are covered with a molding compound 534 such that the distal end region 518 of the first metal clip 514 protrudes through the mold compound 534 to provide a test terminal for the molded semiconductor module 536 before embedding in a printed circuit board. The distal end region 530 of the second metal clip 526 also protrudes through the mold compound 534 to provide another (separate) test terminal for the molded semiconductor module 536 before PCB embedding. The distal end region 530 of the second metal clip 526 may protrude through a different side of the mold compound 534 as the distal end region 518 of the first metal clip 514. The third metal terminal 532 also may be partly exposed from the mold compound 534 to provide yet another (separate) test terminal for the molded semiconductor module 536 before PCB embedding. Instead, the metal block 500 may be contacted to electrically access the corresponding terminal at the backside of the semiconductor die 502 during module testing.

After testing of the molded semiconductor module 536 via the distal end regions 518, 530 of the metal clips 514, 526 and via the exposed part of the third metal terminal 532 or the metal block 500, openings (not shown) are formed in the surface 538 of the molding compound 534 that faces the same direction as the side 506 of the semiconductor die 502 with the first metal contact pad 508. A group of one or more openings expose a corresponding clip contact region 516/524/528 covered by the molding compound 534. The openings may be formed by laser drilling, mechanical drilling, etching, etc. and subsequently filled with an electrically conductive material, e.g., by plating, deposition, etc. Accordingly, the contact region 516, 524, 528 of each metal clip 514, 526 for the molded semiconductor module 536 is configured for permanent electrical contact through the corresponding group of opening(s) formed in the molding compound 534. The module production stages shown in FIGS. 5A through 5C may be carried out via a batch process, as previously described herein. After module production and testing, the molded semiconductor module 536 may be embedded in a PCB, e.g., in accordance with the method illustrated in FIGS. 4A through 4G.

Although the present disclosure is not so limited, the following numbered examples demonstrate one or more aspects of the disclosure.

Example 1. A molded semiconductor module, comprising: a metal block; a semiconductor die attached to a first main surface of the metal block, the semiconductor die having a first metal contact pad at a side of the semiconductor die facing away from the metal block; a first metal terminal having a first contact region attached to the first metal contact pad of the semiconductor die and a distal end region that joins the first contact region and is bent upward in a direction away from the metal block such that the distal end region has a free end which terminates at a further distance from the metal block than the first contact region; and a molding compound encapsulating the semiconductor die and covering the first contact region of the first metal terminal, wherein the distal end region of the first metal terminal protrudes through a surface of the molding compound that faces a same direction as the side of the semiconductor die with the first metal contact pad.

Example 2. The molded semiconductor module of example 1, wherein the metal block has a second main surface opposite the first main surface and a border extending between the first main surface and the second main surface, and wherein the distal end region of the first metal terminal does not extend beyond the border of the metal block.

Example 3. The molded semiconductor module of example 1 or 2, wherein the molded semiconductor module has a rated voltage in a range of 750V to 1200V.

Example 4. The molded semiconductor module of any of examples 1 through 3, wherein the first metal terminal is a metal clip.

Example 5. The molded semiconductor module of any of examples 1 through 3, wherein the first metal terminal is a metal ribbon.

Example 6. The molded semiconductor module of any of examples 1 through 5, wherein the distal end region of the first metal terminal is configured for electrical probing during electrical testing of the molded semiconductor module, and wherein the first contact region of the first metal terminal is configured for permanent electrical contact through one or more openings in the molding compound.

Example 7. The molded semiconductor module of any of examples 1 through 6, wherein the first contact region of the first metal terminal has a thickness of at least 100 microns, and wherein the first metal contact pad of the semiconductor die has a thickness of 10 microns or less.

Example 8. The molded semiconductor module of any of examples 1 through 7, wherein the first contact region of the first metal terminal is at least ten times thicker than the first metal contact pad of the semiconductor die.

Example 9. The molded semiconductor module of any of examples 1 through 8, wherein the semiconductor die has a second metal contact pad at the same side of the semiconductor die with the first metal contact pad, wherein the first metal terminal has a second contact region attached to the second metal contact pad of the semiconductor die, and wherein the second contact region and the first contact region of the first metal terminal are joined to one another.

Example 10. The molded semiconductor module of example 9, wherein the semiconductor die has a third metal contact pad at the same side of the semiconductor die with the first metal contact pad and the second metal contact pad, the molded semiconductor module further comprising: a second metal terminal having a contact region attached to the third metal contact pad of the semiconductor die and a distal end region that joins the contact region of the second metal terminal and is bent upward in a direction away from the metal block such that the distal end region of the second metal terminal has a free end which terminates at a further distance from the metal block than the contact region of the second metal terminal, wherein the distal end region of the second metal terminal protrudes through the surface of the molding compound that faces the same direction as the side of the semiconductor die with the first metal contact pad, the second metal contact pad and the third metal contact pad.

Example 11. The molded semiconductor module of example 10, further comprising: a third metal terminal having a contact region attached to the first main surface of the metal block and a distal end region that joins the contact region of the third metal terminal and is bent upward in a direction away from the metal block such that the distal end region of the third metal terminal has a free end which terminates at a further distance from the metal block than the contact region of the third metal terminal, wherein the distal end region of the third metal terminal protrudes through the surface of the molding compound that faces the same direction as the side of the semiconductor die with the first metal contact pad, the second metal contact pad and the third metal contact pad.

Example 12. The molded semiconductor module of any of examples 1 through 10, further comprising: an additional metal terminal having a contact region attached to the first main surface of the metal block and a distal end region that joins the contact region of the additional metal terminal and is bent upward in a direction away from the metal block such that the distal end region of the additional metal terminal has a free end which terminates at a further distance from the metal block than the contact region of the additional metal terminal, wherein the distal end region of the additional metal terminal protrudes through the surface of the molding compound that faces the same direction as the side of the semiconductor die with the first metal contact pad.

Example 13. A method of producing a molded semiconductor module, the method comprising: attaching a semiconductor die to a first main surface of a metal block, the semiconductor die having a first metal contact pad at a side of the semiconductor die facing away from the metal block; attaching a first contact region of a first metal terminal to the first metal contact pad of the semiconductor die, the first metal terminal having a distal end region that joins the first contact region and is bent upward in a direction away from the metal block such that the distal end region has a free end which terminates at a further distance from the metal block than the first contact region; and covering the semiconductor die and the first contact region of the first metal terminal with a molding compound such that the distal end region of the first metal terminal protrudes through a surface of the molding compound that faces a same direction as the side of the semiconductor die with the first metal contact pad.

Example 14. The method of example 13, wherein the first metal terminal is a metal ribbon, the method further comprising: after attaching the first contact region of the first metal terminal to the first metal contact pad of the semiconductor die and prior to covering the semiconductor die and the first contact region of the first metal terminal with the molding compound, bending an unattached part of the metal ribbon away from the metal block to form the distal end region of the first metal terminal.

Example 15. The method of example 13 or 14, further comprising: probing the distal end region of the first metal terminal during electrical testing of the molded semiconductor module.

Example 16. The method of any of examples 13 through 15, wherein the semiconductor die has a second metal contact pad at the same side of the semiconductor die with the first metal contact pad, the method further comprising: attaching a second contact region of the first metal terminal to the second metal contact pad of the semiconductor die, wherein the second contact region and the first contact region of the first metal terminal are joined to one another.

Example 17. The method of example 16, wherein the semiconductor die has a third metal contact pad at the same side of the semiconductor die with the first metal contact pad and the second metal contact pad, the method further comprising: attaching a contact region of a second metal terminal to the third metal contact pad of the semiconductor die, the second metal terminal having a distal end region that joins the contact region of the second metal terminal and is bent upward in a direction away from the metal block such that the distal end region of the second metal terminal has a free end which terminates at a further distance from the metal block than the contact region of the second metal terminal; and covering the contact region of the second metal terminal with the molding compound such that the distal end region of the second metal terminal protrudes through the surface of the molding compound that faces the same direction as the side of the semiconductor die with the first metal contact pad, the second metal contact pad and the third metal contact pad.

Example 18. The method of example 17, further comprising: attaching a contact region of a third metal terminal to the first main surface of the metal block, the third metal terminal having a distal end region that joins the contact region of the third metal terminal and is bent upward in a direction away from the metal block such that the distal end region of the third metal terminal has a free end which terminates at a further distance from the metal block than the contact region of the third metal terminal; and covering the contact region of the third metal terminal with the molding compound such that the distal end region of the third metal terminal protrudes through the surface of the molding compound that faces the same direction as the side of the semiconductor die with the first metal contact pad, the second metal contact pad and the third metal contact pad.

Example 19. The method of any of examples 13 through 17, further comprising: attaching a contact region of an additional metal terminal to the first main surface of the metal block, the additional metal terminal having a distal end region that joins the contact region of the additional metal terminal and is bent upward in a direction away from the metal block such that the distal end region of the additional metal terminal has a free end which terminates at a further distance from the metal block than the contact region of the additional metal terminal; and covering the contact region of the additional metal terminal with the molding compound such that the distal end region of the additional metal terminal protrudes through the surface of the molding compound that faces the same direction as the side of the semiconductor die with the first metal contact pad.

Example 20. An electronic assembly, comprising: a printed circuit board; and a molded semiconductor module embedded in an electrically insulating body of the printed circuit board, wherein the molded semiconductor module comprises: a semiconductor die attached to a first main surface of a metal block, the semiconductor die having a first metal contact pad at a side of the semiconductor die facing away from the metal block; a first metal terminal having a contact region attached to the first metal contact pad of the semiconductor die and a distal end region that joins the contact region and is bent upward in a direction away from the metal block such that the distal end region has a free end which terminates at a further distance from the metal block than the contact region; and a molding compound encapsulating the semiconductor die and covering the contact region of the first metal terminal, wherein the distal end region of the first metal terminal protrudes through a surface of the molding compound that faces a same direction as the side of the semiconductor die with the first metal contact pad, wherein the electrically insulating body of the printed circuit board encapsulates the contact region and the distal end region of the first metal terminal.

Example 21. The electronic assembly of example 20, further comprising: a plurality of openings extending through both the electrically insulating body of the printed circuit board and the molding compound of the molded semiconductor module to the contact region of the first metal terminal; and an electrically conductive material in the plurality of openings.

Example 22. A method of producing an electronic assembly, the method comprising: embedding a molded semiconductor module in an electrically insulating body of a printed circuit board, the molded semiconductor module comprising: a semiconductor die attached to a first main surface of a metal block, the semiconductor die having a first metal contact pad at a side of the semiconductor die facing away from the metal block; a first metal terminal having a contact region attached to the first metal contact pad of the semiconductor die and a distal end region that joins the contact region and is bent upward in a direction away from the metal block such that the distal end region has a free end which terminates at a further distance from the metal block than the contact region; and a molding compound encapsulating the semiconductor die and covering the contact region of the first metal terminal, wherein the distal end region of the first metal terminal protrudes through a surface of the molding compound that faces a same direction as the side of the semiconductor die with the first metal contact pad, wherein the electrically insulating body of the printed circuit board encapsulates the contact region and the distal end region of the first metal terminal; forming a plurality of openings in both the electrically insulating body of the printed circuit board and the molding compound of the molded semiconductor module that expose the contact region of the first metal terminal; and filling the plurality of openings with an electrically conductive material.

Example 23. A molded semiconductor module for embedding in a printed circuit board, the molded semiconductor module comprising: a metal block; a semiconductor die attached to a first main surface of the metal block, the semiconductor die having a first metal contact pad at a side of the semiconductor die facing away from the metal block; a first metal clip having a first contact region attached to the first metal contact pad of the semiconductor die and a distal end region; and a molding compound encapsulating the semiconductor die and covering the first contact region of the first metal clip, wherein the distal end region of the first metal clip protrudes through the mold compound to provide a test terminal for the molded semiconductor module before embedding in the printed circuit board.

Example 24. The molded semiconductor module of example 23, wherein the semiconductor die has a second metal contact pad at the same side of the semiconductor die with the first metal contact pad, the molded semiconductor module further comprising: a second metal clip having a contact region attached to the second metal contact pad of the semiconductor die and a distal end region that protrudes through the molding compound to provide an additional test terminal for the molded semiconductor module before embedding in the printed circuit board.

Example 25. A printed circuit board, comprising: a molded semiconductor module comprising: a metal block; a semiconductor die attached to a first main surface of the metal block, the semiconductor die having a first metal contact pad at a side of the semiconductor die facing away from the metal block; a first metal terminal having a first contact region attached to the first metal contact pad of the semiconductor die and a distal end region that joins the first contact region; a molding compound encapsulating the semiconductor die and covering the first contact region of the first metal terminal; an upper printed circuit board layer on the side of the molded semiconductor module facing away from the metal block; a lower printed circuit board layer on the other side of the molded semiconductor module to embed the molded semiconductor in the printed circuit board; and a via connection through the upper printed circuit board layer and molding compound to connect to the first metal terminal, wherein the distal end region of the first metal terminal extends from the mold compound to provide a test terminal for the molded semiconductor module before embedding in the printed circuit board, wherein the distal end region of the molded semiconductor module as embedded in the printed circuit board is not contacted by a metal connector outside the molded semiconductor module.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A molded semiconductor module, comprising:
   a metal block;
   a semiconductor die attached to a first main surface of the metal block, the semiconductor die having a first metal contact pad at a side of the semiconductor die facing away from the metal block;
   a first metal terminal having a first contact region attached to the first metal contact pad of the semiconductor die and a distal end region that joins the first contact region and is bent upward in a direction away from the metal block such that the distal end region has a free end which terminates at a further distance from the metal block than the first contact region; and
   a molding compound encapsulating the semiconductor die and covering the first contact region of the first metal terminal,
   wherein the distal end region of the first metal terminal protrudes through a surface of the molding compound that faces a same direction as the side of the semiconductor die with the first metal contact pad.

2. The molded semiconductor module of claim 1, wherein the metal block has a second main surface opposite the first main surface and a border extending between the first main surface and the second main surface, and wherein the distal end region of the first metal terminal does not extend beyond the border of the metal block.

3. The molded semiconductor module of claim 1, wherein the molded semiconductor module has a rated voltage in a range of 750V to 1200V.

4. The molded semiconductor module of claim 1, wherein the first metal terminal is a metal clip.

5. The molded semiconductor module of claim 1, wherein the first metal terminal is a metal ribbon.

6. The molded semiconductor module of claim 1, wherein the distal end region of the first metal terminal is configured for electrical probing during electrical testing of the molded semiconductor module, and wherein the first contact region of the first metal terminal is configured for permanent electrical contact through one or more openings in the molding compound.

7. The molded semiconductor module of claim 1, wherein the first contact region of the first metal terminal has a thickness of at least 100 microns, and wherein the first metal contact pad of the semiconductor die has a thickness of 10 microns or less.

8. The molded semiconductor module of claim 1, wherein the first contact region of the first metal terminal is at least ten times thicker than the first metal contact pad of the semiconductor die.

9. The molded semiconductor module of claim 1, wherein the semiconductor die has a second metal contact pad at the same side of the semiconductor die with the first metal contact pad, wherein the first metal terminal has a second contact region attached to the second metal contact pad of the semiconductor die, and wherein the second contact region and the first contact region of the first metal terminal are joined to one another.

10. The molded semiconductor module of claim 9, wherein the semiconductor die has a third metal contact pad at the same side of the semiconductor die with the first metal contact pad and the second metal contact pad, the molded semiconductor module further comprising:
   a second metal terminal having a contact region attached to the third metal contact pad of the semiconductor die and a distal end region that joins the contact region of the second metal terminal and is bent upward in a direction away from the metal block such that the distal end region of the second metal terminal has a free end which terminates at a further distance from the metal block than the contact region of the second metal terminal,
   wherein the distal end region of the second metal terminal protrudes through the surface of the molding compound that faces the same direction as the side of the semiconductor die with the first metal contact pad, the second metal contact pad and the third metal contact pad.

11. The molded semiconductor module of claim 10, further comprising:
   a third metal terminal having a contact region attached to the first main surface of the metal block and a distal end region that joins the contact region of the third metal terminal and is bent upward in a direction away from the metal block such that the distal end region of the third metal terminal has a free end which terminates at a further distance from the metal block than the contact region of the third metal terminal,
   wherein the distal end region of the third metal terminal protrudes through the surface of the molding compound that faces the same direction as the side of the semiconductor die with the first metal contact pad, the second metal contact pad and the third metal contact pad.

12. The molded semiconductor module of claim 1, further comprising:
   an additional metal terminal having a contact region attached to the first main surface of the metal block and a distal end region that joins the contact region of the additional metal terminal and is bent upward in a direction away from the metal block such that the distal end region of the additional metal terminal has a free end which terminates at a further distance from the metal block than the contact region of the additional metal terminal,
   wherein the distal end region of the additional metal terminal protrudes through the surface of the molding compound that faces the same direction as the side of the semiconductor die with the first metal contact pad.

13. A method of producing a molded semiconductor module, the method comprising:
   attaching a semiconductor die to a first main surface of a metal block, the semiconductor die having a first metal contact pad at a side of the semiconductor die facing away from the metal block;
   attaching a first contact region of a first metal terminal to the first metal contact pad of the semiconductor die, the first metal terminal having a distal end region that joins the first contact region and is bent upward in a direction away from the metal block such that the distal end region has a free end which terminates at a further distance from the metal block than the first contact region; and
   covering the semiconductor die and the first contact region of the first metal terminal with a molding compound such that the distal end region of the first metal terminal protrudes through a surface of the molding compound that faces a same direction as the side of the semiconductor die with the first metal contact pad.

14. The method of claim 13, wherein the first metal terminal is a metal ribbon, the method further comprising:
   after attaching the first contact region of the first metal terminal to the first metal contact pad of the semiconductor die and prior to covering the semiconductor die and the first contact region of the first metal terminal with the molding compound, bending an unattached part of the metal ribbon away from the metal block to form the distal end region of the first metal terminal.

15. The method of claim 13, further comprising:
   probing the distal end region of the first metal terminal during electrical testing of the molded semiconductor module.

16. The method of claim 13, wherein the semiconductor die has a second metal contact pad at the same side of the semiconductor die with the first metal contact pad, the method further comprising:
   attaching a second contact region of the first metal terminal to the second metal contact pad of the semiconductor die,
   wherein the second contact region and the first contact region of the first metal terminal are joined to one another.

17. The method of claim 16, wherein the semiconductor die has a third metal contact pad at the same side of the semiconductor die with the first metal contact pad and the second metal contact pad, the method further comprising:
   attaching a contact region of a second metal terminal to the third metal contact pad of the semiconductor die, the second metal terminal having a distal end region that joins the contact region of the second metal terminal and is bent upward in a direction away from the metal block such that the distal end region of the second metal terminal has a free end which terminates at a further distance from the metal block than the contact region of the second metal terminal; and
   covering the contact region of the second metal terminal with the molding compound such that the distal end region of the second metal terminal protrudes through the surface of the molding compound that faces the same direction as the side of the semiconductor die with the first metal contact pad, the second metal contact pad and the third metal contact pad.

18. The method of claim 17, further comprising:
   attaching a contact region of a third metal terminal to the first main surface of the metal block, the third metal terminal having a distal end region that joins the contact region of the third metal terminal and is bent upward in a direction away from the metal block such that the distal end region of the third metal terminal has a free end which terminates at a further distance from the metal block than the contact region of the third metal terminal; and
   covering the contact region of the third metal terminal with the molding compound such that the distal end region of the third metal terminal protrudes through the surface of the molding compound that faces the same direction as the side of the semiconductor die with the first metal contact pad, the second metal contact pad and the third metal contact pad.

19. The method of claim 13, further comprising:

attaching a contact region of an additional metal terminal to the first main surface of the metal block, the additional metal terminal having a distal end region that joins the contact region of the additional metal terminal and is bent upward in a direction away from the metal block such that the distal end region of the additional metal terminal has a free end which terminates at a further distance from the metal block than the contact region of the additional metal terminal; and covering the contact region of the additional metal terminal with the molding compound such that the distal end region of the additional metal terminal protrudes through the surface of the molding compound that faces the same direction as the side of the semiconductor die with the first metal contact pad.

20. An electronic assembly, comprising:

a printed circuit board; and a molded semiconductor module embedded in an electrically insulating body of the printed circuit board, wherein the molded semiconductor module comprises:

a semiconductor die attached to a first main surface of a metal block, the semiconductor die having a first metal contact pad at a side of the semiconductor die facing away from the metal block;

a first metal terminal having a contact region attached to the first metal contact pad of the semiconductor die and a distal end region that joins the contact region and is bent upward in a direction away from the metal block such that the distal end region has a free end which terminates at a further distance from the metal block than the contact region; and a molding compound encapsulating the semiconductor die and covering the contact region of the first metal terminal, wherein the distal end region of the first metal terminal protrudes through a surface of the molding compound that faces a same direction as the side of the semiconductor die with the first metal contact pad, wherein the electrically insulating body of the printed circuit board encapsulates the contact region and the distal end region of the first metal terminal.

21. The electronic assembly of claim 20, further comprising:

a plurality of openings extending through both the electrically insulating body of the printed circuit board and the molding compound of the molded semiconductor module to the contact region of the first metal terminal; and an electrically conductive material in the plurality of openings.

22. A method of producing an electronic assembly, the method comprising:

embedding a molded semiconductor module in an electrically insulating body of a printed circuit board, the molded semiconductor module comprising: a semiconductor die attached to a first main surface of a metal block, the semiconductor die having a first metal contact pad at a side of the semiconductor die facing away from the metal block; a first metal terminal having a contact region attached to the first metal contact pad of the semiconductor die and a distal end region that joins the contact region and is bent upward in a direction away from the metal block such that the distal end region has a free end which terminates at a further distance from the metal block than the contact region; and a molding compound encapsulating the semiconductor die and covering the contact region of the first metal terminal, wherein the distal end region of the first metal terminal protrudes through a surface of the molding compound that faces a same direction as the side of the semiconductor die with the first metal contact pad, wherein the electrically insulating body of the printed circuit board encapsulates the contact region and the distal end region of the first metal terminal;

forming a plurality of openings in both the electrically insulating body of the printed circuit board and the molding compound of the molded semiconductor module that expose the contact region of the first metal terminal; and filling the plurality of openings with an electrically conductive material.

\* \* \* \* \*